United States Patent
Chen et al.

(10) Patent No.: US 10,847,378 B2
(45) Date of Patent: Nov. 24, 2020

(54) SEMICONDUCTOR DEVICE AND METHOD FOR PLANARIZING THE SAME

(71) Applicant: UNITED MICROELECTRONICS CORP., Hsinchu (TW)

(72) Inventors: Chia-Hung Chen, Tainan (TW); Yu-Huang Yeh, Hsinchu (TW); Chuan-Fu Wang, Zhunan Township (TW); Chin-Chin Tsai, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 13 days.

(21) Appl. No.: 16/177,835

(22) Filed: Nov. 1, 2018

(65) Prior Publication Data
US 2020/0144072 A1 May 7, 2020

(51) Int. Cl.
*H01L 21/321* (2006.01)
*H01L 21/3213* (2006.01)
*H01L 29/423* (2006.01)
*H01L 27/11568* (2017.01)

(52) U.S. Cl.
CPC .... *H01L 21/3212* (2013.01); *H01L 21/32133* (2013.01); *H01L 27/11568* (2013.01); *H01L 29/4234* (2013.01)

(58) Field of Classification Search
CPC .............. H01L 21/3212; H01L 29/4234; H01L 27/11568; H01L 21/32133
See application file for complete search history.

(56) References Cited

U.S. PATENT DOCUMENTS

| 7,709,879 | B2 | 5/2010 | Van Schaijk et al. | |
|---|---|---|---|---|
| 9,379,128 | B1 | 6/2016 | Yi et al. | |
| 2002/0119623 | A1* | 8/2002 | Park | H01L 21/76895 438/253 |
| 2007/0057331 | A1* | 3/2007 | Satou | H01L 21/28097 257/384 |
| 2015/0060974 | A1* | 3/2015 | Sung | H01L 27/11521 257/314 |
| 2018/0151579 | A1* | 5/2018 | Liu | H01L 27/11526 |

* cited by examiner

*Primary Examiner* — Marcos D. Pizarro
*Assistant Examiner* — Sue Tang
(74) *Attorney, Agent, or Firm* — J.C. Patents

(57) ABSTRACT

A semiconductor device includes a substrate, having a cell region and a core region. A plurality of gate structures is disposed on the substrate in the cell region. Each of the gate structures has a spacer on a sidewall of the gate structures. The gate structure includes a charge storage layer, on the substrate; a first polysilicon layer on the charge storage layer; and a mask layer on the first polysilicon layer, the mask layer comprising a first polishing stop layer on top. A preliminary material layer also with the first polishing stop layer on top is disposed on the substrate at the core region. A second polysilicon layer is filled between the gate structures at the cell region. A second polishing stop layer is on the second polysilicon layer. The first polishing stop layer and the second polishing stop layer are same material and same height.

11 Claims, 6 Drawing Sheets

SEMICONDUCTOR DEVICE AND METHOD FOR PLANARIZING THE SAME

BACKGROUND

1. Field of the Invention

The present invention generally relates to semiconductor fabrication technology, and particularly to a semiconductor device and method for fabricating the semiconductor device.

2. Description of Related Art

To have more function for an integrated circuit, a semiconductor device in the current design usually includes the memory cell region and the core region, in which the logic circuit at the core region can access the memory cells in the memory cell region. Even further, some logic device operated at the rage of medium-voltage (MV) or high-voltage (HV) may also be involved in fabrication to integrated a full circuit of semiconductor device.

As to the above trend, the fabrication to form the semiconductor device with more powerful capability, the structure would be more complicate, in which the cell structures are formed at the cell region and the logic devices including the transistors are form at the core region. The structure for the memory cell is also designed being more complicate to have better performance. The memory cells in an example are the dual-gate semiconductor-oxide-nitride-oxide-semiconductor (SONOS) structure.

So, the core logic device the memory cells are fabricated together in a single integrate semiconductor device. An issue at least needed to be considered for design and fabrication includes the planarization over the core region and the memory cell region because of the different process for forming the memory cell and the logic device.

How to get a better planarity for the semiconductor device over the cell region and the core logic device region to adapt the complicate fabrication process is an issue at needed to be improved.

SUMMARY OF THE INVENTION

The invention provides a semiconductor device with better planarity, in which the semiconductor device may include the memory cell and the core logic device, which are fabricated together. The semiconductor device is at the state in semi-complication in fabrication, so to provide a better flat plane as a base for the subsequent process.

In an embodiment, the invention provides a semiconductor device includes a substrate, having a cell region and a core region. A plurality of gate structures is disposed on the substrate in the cell region. Each of the gate structures has a spacer on a sidewall of the gate structures. The gate structure includes a charge storage layer, on the substrate; a first polysilicon layer on the charge storage layer; and a mask layer on the first polysilicon layer, the mask layer comprising a first polishing stop layer on top. A preliminary material layer also with the first polishing stop layer on top is disposed on the substrate at the core region. A second polysilicon layer is filled between the gate structures at the cell region. A second polishing stop layer is on the second polysilicon layer. The first polishing stop layer and the second polishing stop layer are same material and same height.

In an embodiment, as to the semiconductor device, the substrate further comprises a high voltage (HV) device region and a HV gate structure formed on the substrates, wherein the second polysilicon layer with the second polishing stop layer is also disposed on the substrate in the HV device region beside the HV gate structure.

In an embodiment, as to the semiconductor device, the gate structures are memory gates.

In an embodiment, as to the semiconductor device, it further comprises a plurality of doped regions in the substrate at the cell region.

In an embodiment, as to the semiconductor device, it further comprises a plurality of trench isolation structure in the substrate.

In an embodiment, as to the semiconductor device, the charge storage layer is an oxide/nitride/oxide (ONO) structure.

In an embodiment, as to the semiconductor device, the first polishing stop layer and the second polishing stop layer are nitride.

In an embodiment, as to the semiconductor device, each of the gate structures further comprises an oxide layer between the first polishing stop layer and the first polysilicon layer.

In an embodiment, the invention also provides method for planarizing a semiconductor structure. The method comprises providing a semiconductor structure. The semiconductor structure comprises gate structures disposed at a cell region of a substrate and a preliminary material layer disposed at a core region of the substrate. Wherein, the gate structures and the preliminary material layer comprise a first polishing stop layer and a sacrificial layer as stacked at a top portion; a polysilicon layer disposed over the substrate, being conformal over the gate structures and the sacrificial layer; and a second polishing stop layer on the polysilicon layer. The method also comprises performing a first polishing process to at least expose a portion of the polysilicon layer over the gate structures; performing an anisotropic etching process from the exposed portion of the polysilicon layer until the sacrificial layer is exposed. A second polishing process is performed over the substrate and stops at the first and second polishing stop layers.

In an embodiment, as to the method for planarizing a semiconductor structure, the gate structure further comprises a spacer at sidewall to separate the polysilicon layer.

In an embodiment, as to the method for planarizing a semiconductor structure, the exposed portion of the polysilicon layer is wider than the gate structures.

In an embodiment, as to the method for planarizing a semiconductor structure, the sacrificial layer is polysilicon.

In an embodiment, as to the method for planarizing a semiconductor structure, the first polishing stop layer is nitride and the sacrificial layer comprises a sacrificial polysilicon and an oxide between the nitride and the sacrificial polysilicon.

In an embodiment, as to the method for planarizing a semiconductor structure, each gate structure further comprises a charge storage layer on a substrate; a gate polysilicon layer on the charge storage layer; and an oxide layer on the gate polysilicon gate. The first polishing stop layer is formed on the oxide layer.

In an embodiment, as to the method for planarizing a semiconductor structure, the anisotropic etching process is an etching back process with the second polishing stop layer as an etching mask.

In an embodiment, as to the method for planarizing a semiconductor structure, the anisotropic etching process etches the sacrificial layer by a range in thickness of 50% to 90%.

In an embodiment, as to the method for planarizing a semiconductor structure, the semiconductor structure further comprises a high-voltage (HV) gate structure at a HV device region, wherein the sacrificial layer and the first polishing stop layer are also staked on top.

In an embodiment, as to the method for planarizing a semiconductor structure, the anisotropic etching process has a higher etching selection on polysilicon and oxide than that on nitride.

In an embodiment, as to the method for planarizing a semiconductor structure, after performing the anisotropic etching process, a portion of the polysilicon layer and a portion of the sacrificial layer under the exposed portion of the polysilicon layer caused by the first polishing process are removed to have a recess over the gate structure, wherein a protruding portion at both sides of the gate structures remains.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to semiconductor fabrication technology. The semiconductor device is an integrated structure of memory cell and logic device. The invention can provide a better planarity in planarizing the semiconductor device over the cell region and the core logic region.

Several embodiments are provided for describing the invention but the invention is not just limited to the embodiments as provided.

Figure 1:
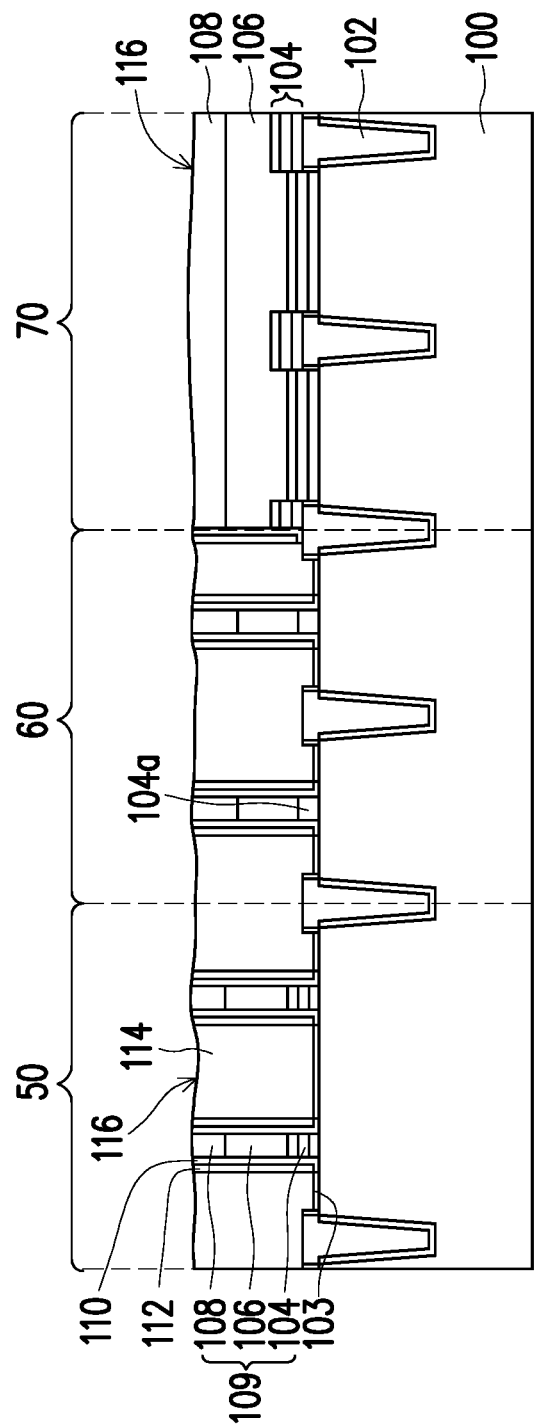
FIG. 1 is a drawing, schematically illustrating a structure of semiconductor device as looked into, according to an embodiment of the invention.

FIG. 1 is a drawing, schematically illustrating a structure of semiconductor device as looked into, according to an embodiment of the invention. Referring to FIG. 1, a semiconductor device with the memory cell region and a core region are involved in the fabrication process. The invention has looked into the issue exiting in the structure of semiconductor device and at least provided fabrication with an improvement on planarization at the middle stage in the whole stage of fabrication.

The semiconductor device in an example include the memory cell with the dual-gate SONOS structure formed in a cell region 50 of a substrate 100 while logic device would be formed at the core region 70 of the substrate 100. The shallow trench isolation (STI) structures 102 are formed in the substrate to define the active regions for the memory cells and the logic devices. The substrate 100 may also has various doped regions, which are usually known in the art without descriptions. A pad oxide layer 103 may also be formed on the substrate 100 but is not limited to.

The gate structures 109 for the memory cells are formed in the cell region 50 have been formed with the core region 70 has the preliminary layer, including multiple layers similar to the stack structure of the gate structure 109 but not actually fabricated to form the logic device yet.

The gate structures 109 for the memory cells may include the charge storage layer 104 of oxide-nitride-oxide (ONO) structure to server as the gate insulate layer. A gate layer 106 of polysilicon is on the charge storage layer 104. An oxide cap layer 108 is disposed on the gate layer 106. In addition, an oxide spacer 110 with a nitride spacer 112 are disposed on the sidewall of the gate structures 109. In addition, to the dual gate SONOS cell, the selection gate layer 114 is also filled between the gate structures 109 and isolate from the gate structures 109 by the oxide spacer 110 and the nitride spacer 112.

In the core region 70 for forming the logic device, a preliminary layer as a stack of the charge storage layer 104, the gate layer 106 and the oxide cap layer 108 is also formed in the deposition processes when the stack layer for the gate structures 109 is formed at the cell region 50. Even further, some HV gates similar to the gate structure 109 are also formed in the HV region 60, in which the gate insulating layer 104a with larger thickness is involved.

Remarkably, the issues as looked into in the invention is that the topology at the top surface 116 is not even after the usual way of etching process to remove a certain amount of the top portion because it is difficult to get the etching condition, having non-etching selection for various materials including oxide, nitride, and polysilicon.

At the current stage, the topology at the top surface 116 is not even. The top surface 116 has poor planarity and then would affect the subsequent fabrication processes. The invention has proposed a modified fabrication process to get batter planarity on the top surface 116.

FIG. 2A to FIG. 2E are drawings, schematically illustrating a method for planarizing the semiconductor device, according to an embodiment of the invention.

Figure 2A:
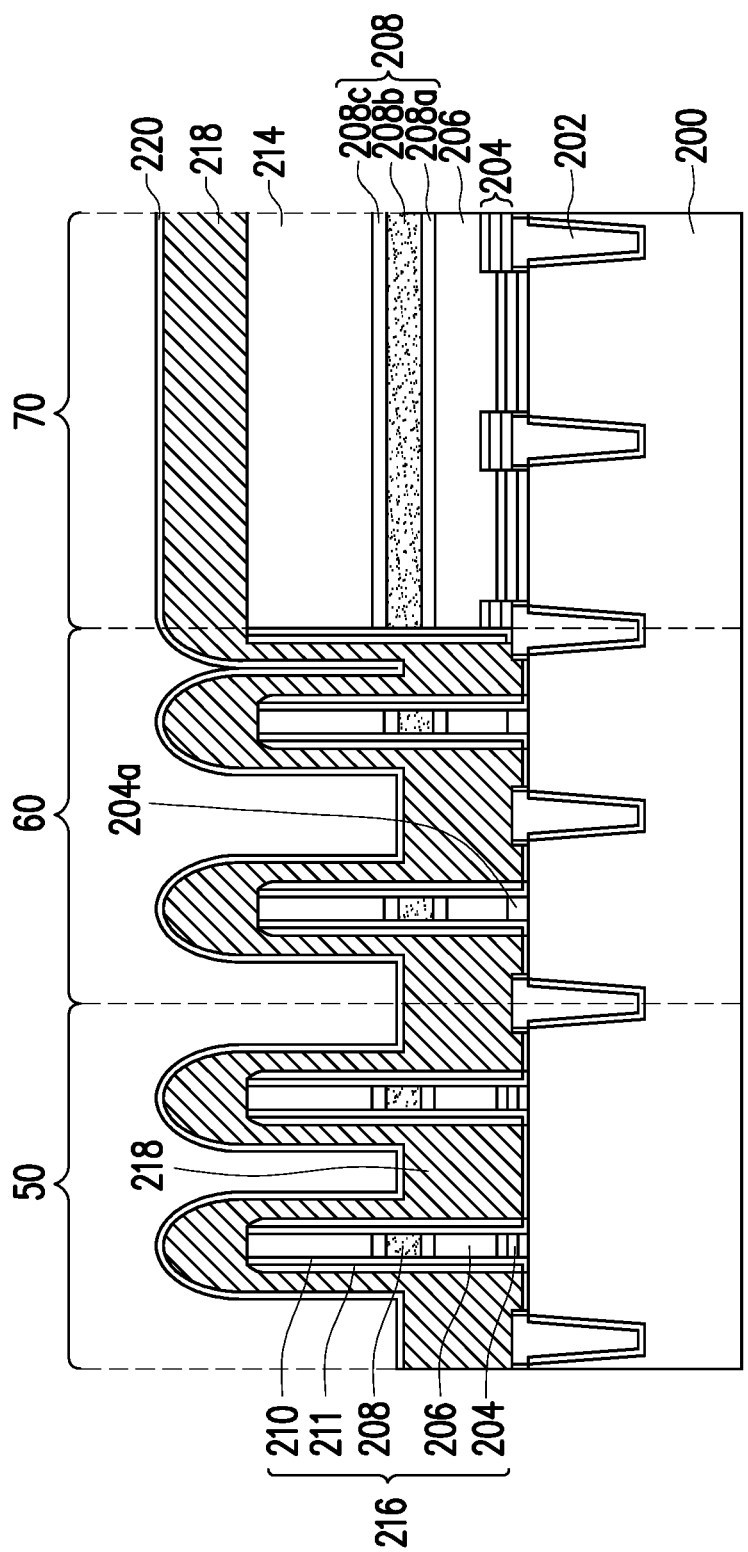
FIG. 2A to FIG. 2E are drawings, schematically illustrating a method for planarizing the semiconductor device, according to an embodiment of the invention.

Referring to FIG. 2A, a substrate 200 is provided. Multiple STI structures 202 are formed in the substrate 200 to define the active region for the device. The substrate 200 includes a memory cell region 50 and a core region 70, and also the HV region 60 if it is needed.

The gate structures 216 for the memory cells are formed in the memory cell region and may include the charge storage layer 204, such as the ONO structure in an embodiment, to also server as the gate insulate layer. A gate layer 206, such as polysilicon, is disposed on the charge storage layer 204. A mask 208 is disposed on the gate layer 206. The mask layer 208 may include a polishing stop layer 208b, such as nitride layer. The top and the bottom of the polishing stop layer 208b in an embodiment may be the lower oxide layer 208a and the upper oxide layer 208c for improve the adhering capability to polysilicon material but the invention is not limited to. Due to the need in fabrication for the intended structure, a sacrificial layer 214, such as polysilicon layer, is also disposed on the mask layer 208.

The gate structures 216 may also include an oxide spacer 210 with a nitride spacer 211, disposed on the sidewall of the gate structures 216. In addition, to the dual gate SONOS cell, a polysilicon layer 218 is formed over the substrate in conformal structure to the topology at the top, wherein a portion of the polysilicon layer 218 is filled between the gate structures 216 and is isolated from the gate structures 216 by the oxide spacer 210 and the nitride spacer 211. At the current stage, the polysilicon layer 218 is at the primary state and is to be subsequently processed to serve as a selection gate as to be seen in FIG. 2E.

Further, another polishing stop layer 220, such as nitride layer, is formed on the polysilicon layer 218. The polishing stop layer 220 in an embodiment is the same material as the polishing stop layer 208b of the mask layer 208. The effect of both the polishing stop layer 220 and the polishing stop layer 208b would be described later in subsequent processes.

In the HV region 60, the gate structures 216 are similar to the gate structures 216 in the cell region 50 but the charge storage layer 204 is replaced by a gate insulating layer 204a with sufficient thickness for the operation at the voltage level within the HV range.

Figure 2B:
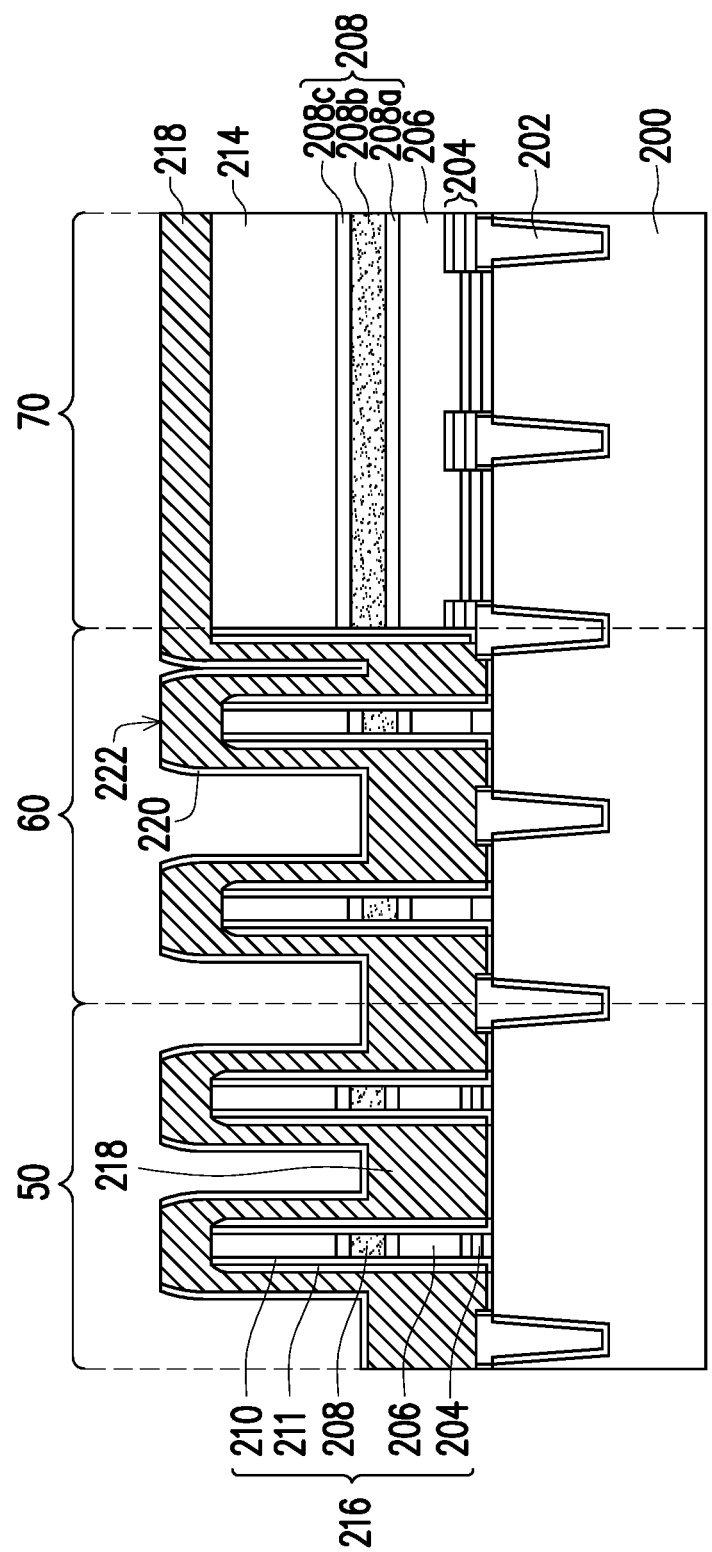

Referring to FIG. 2B, a polishing process is performed over the substrate to at least expose a portion 222 of the polysilicon layer 218 over the gate structures 216. In an embodiment, the polishing process may be chemical mechanical polishing (CMP) process. The first stage of polishing process has a light loading because it has been sufficient to expose the portion 222 of the polysilicon layer 218.

Figure 2C:
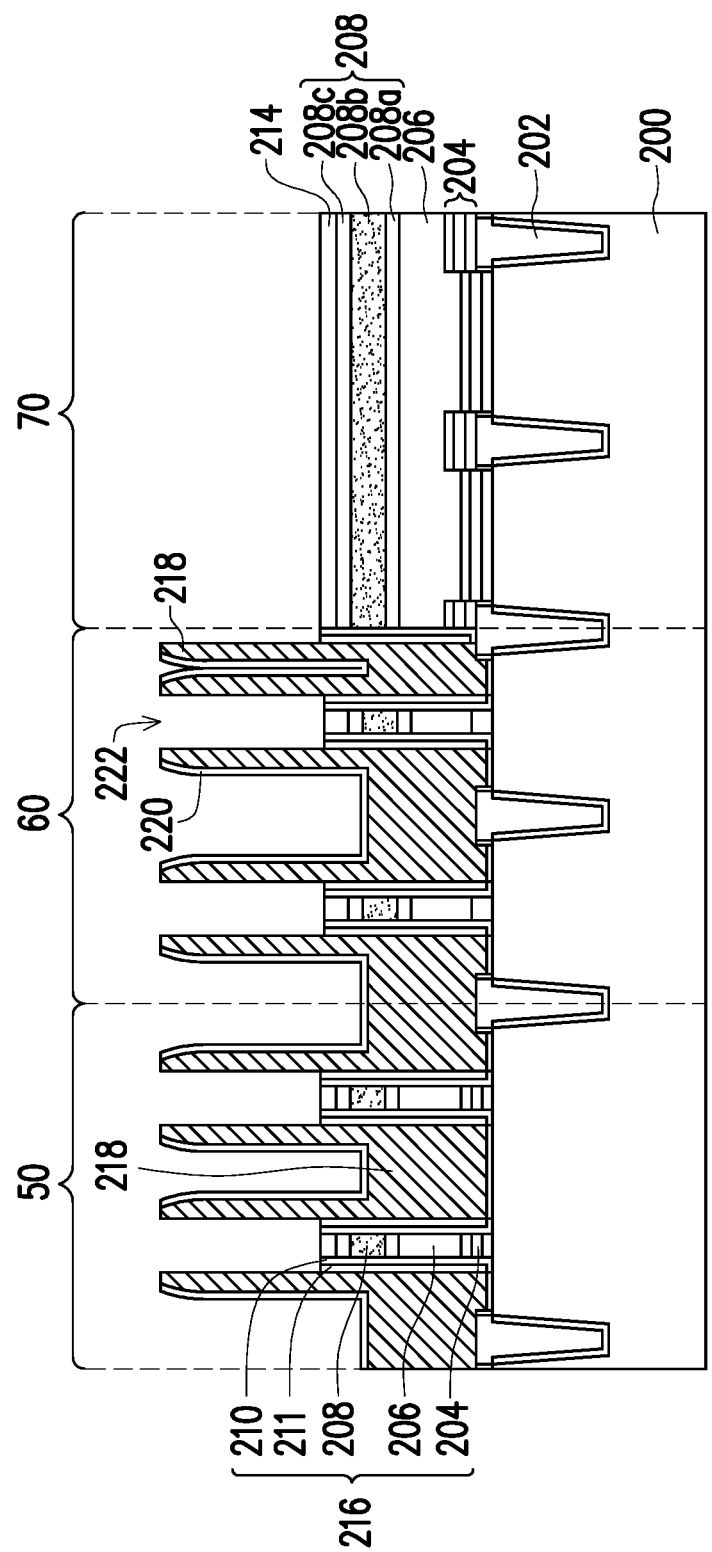

Referring to FIG. 2C, an anisotropic etching process, such as etching back process, is performed. In an embodiment, the etchant used in the etching process is relatively easy made with loose condition for the etching selection without strictly need of uniform etching selection for all materials, including silicon, oxide and nitride. The etching to etching silicon and oxide may be made without much difficulty.

An anisotropic etching process is the performed to etch materials from the exposed portion 222 of the polysilicon layer 218 until the sacrificial layer 214 is exposed, in which the polishing stop layer 220 also serves as an etching mask. In this etching process, the polysilicon layer 218 and the sacrificial layer 214 are etched, in which the height of the sacrificial layer 214 may be rather close to the mask layer 208. However, a portion of the polysilicon layer 218 covered by the polishing stop layer 220 remains as a protruding structure. A significant amount of polysilicon layer 218 and the sacrificial layer 214 are removed, so the residual part is not much and can be easily further polished away with lightly polishing loading. In an embodiment, the sacrificial layer 214 in depth is removed by a range of 50% to 90% to reduce the polishing loading for the subsequent polishing process.

Figure 2D:
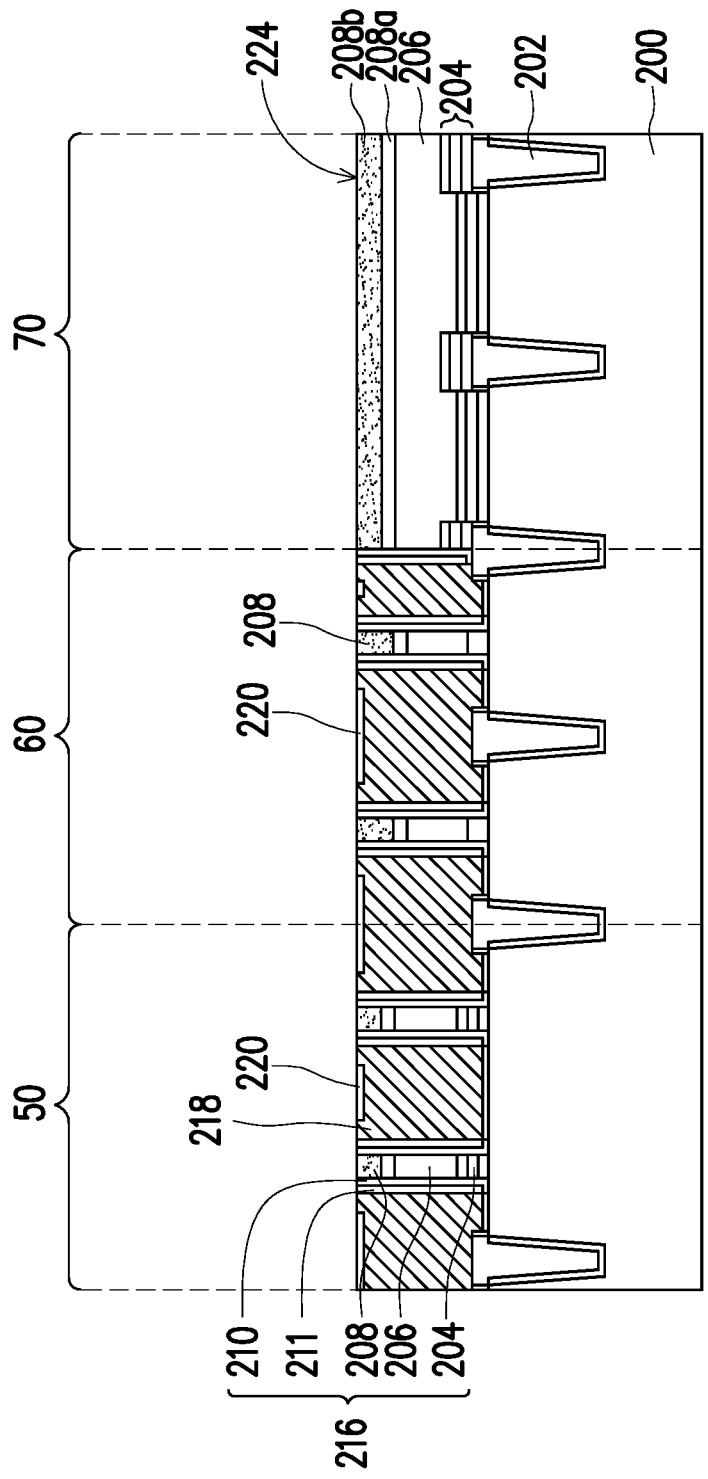
Figure 2E:
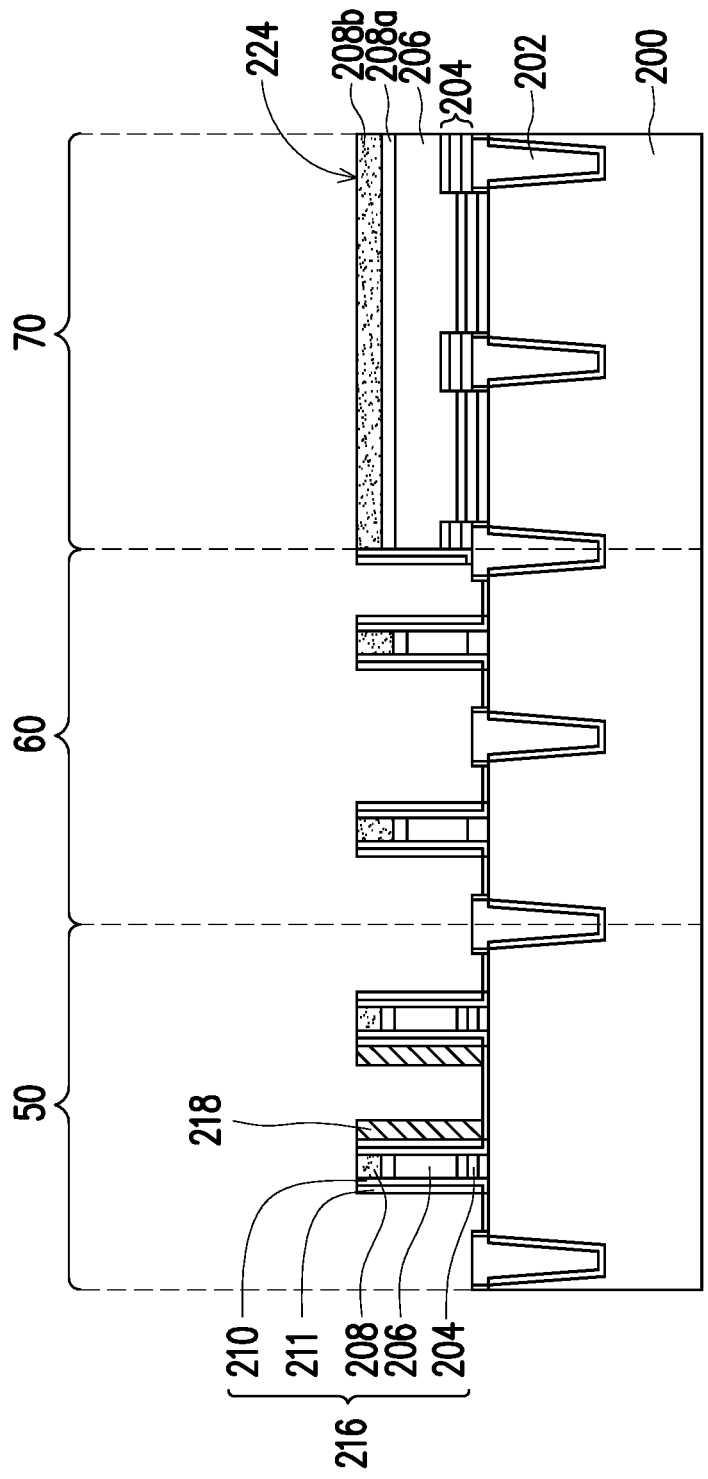

Referring to FIG. 2D, a second stage of polishing process is performed over the substrate 200 to have a planarized top plane 224. In an embodiment, the second stage of polishing process is performed and stops on the polishing stop layer 220 in the cell region 50 and on the polishing stop layer 208b at the core region 208b, also on the polishing stop layer 220 in HV region 60.

In this polishing process, the residual part as a protruding structure does not cause much polishing loading, the quality of polishing process can be easily achieved. As a result, the planarized top plane 224 has better planarity.

In the subsequent fabrication process, various structure elements may be formed based on the planarized top plane 224. However, the invention is not limited to specific subsequent processes. In an embodiment, referring to FIG. 2E, the polysilicon layer 218 may be patterned to actually form a selection gate. The remaining portion of the polysilicon layer 218 serves as the selection gate adjacent to the gate structure 216 of memory cell to form the dual-gate structure for the SONOS cell, in an embodiment. The selection gate, also indicated by 218, is isolated from the gate structure 216 by the spacer including the oxide spacer 210 and the nitride spacer 211 in an embodiment.

The invention has sequence to perform a first stage of polishing process, an etching back process, and a second stage of polishing process, in which the polishing stop layers 220, 208b provide the polishing stop and the etching back process may easily remove most of polysilicon material and oxide material. As a result, the second stage of polishing process has less loading and the planarity is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for planarizing a semiconductor structure, comprising:
   providing a semiconductor structure, the semiconductor structure comprising gate structures disposed at a cell region of a substrate and a preliminary material layer disposed at a core region of the substrate, wherein the gate structures and the preliminary material layer comprise a first polishing stop layer and a sacrificial layer as stacked over the first polishing stop layer at a top portion of the preliminary material layer; a polysilicon layer disposed over the substrate, being conformal over the gate structures and the sacrificial layer; and a second polishing stop layer on the polysilicon layer;
   performing a first polishing process to at least expose a portion of the polysilicon layer over the gate structures;
   performing an anisotropic etching process from the exposed portion of the polysilicon layer until the sacrificial layer is exposed; and
   performing a second polishing process over the substrate, stopping at a portion of the first and second polishing stop layers.

2. The method of claim 1, wherein the gate structure further comprises a spacer at sidewall to separate the gate structure from the polysilicon layer.

3. The method of claim 1, wherein the exposed portion of the polysilicon layer is wider than the gate structures.

4. The method of claim 1, wherein the sacrificial layer is polysilicon.

5. The method of claim 1, wherein the first polishing stop layer is nitride and the sacrificial layer comprises a sacrificial polysilicon and an oxide between the nitride and the sacrificial polysilicon.

6. The method of claim 1, wherein each gate structure further comprises:
   a charge storage layer on a substrate;
   a gate polysilicon layer on the charge storage layer; and
   an oxide layer on the gate polysilicon gate,
   wherein the first polishing stop layer is formed on the oxide layer.

7. The method of claim 1, wherein the anisotropic etching process is an etching back process with the second polishing stop layer as an etching mask.

8. The method of claim 1, wherein the anisotropic etching process etches the sacrificial layer by a range in thickness of 50% to 90%.

9. The method of claim 1, wherein the semiconductor structure further comprises a high-voltage (HV) gate structure at a HV device region, wherein the sacrificial layer and the first polishing stop layer are also staked on top.

10. The method of claim 1, wherein the anisotropic etching process has a higher etching selection on polysilicon and oxide than that on nitride.

11. The method of claim 1, wherein after performing the anisotropic etching process, a portion of the polysilicon layer and a portion of the sacrificial layer under the exposed portion of the polysilicon layer caused by the first polishing process are removed to have a recess over the gate structure, wherein a protruding portion at both sides of the gate structures remains.

* * * * *